(12) United States Patent
Rich et al.

(10) Patent No.: US 6,514,389 B1
(45) Date of Patent: *Feb. 4, 2003

(54) METHOD OF PROCESSING A WORKPIECE

(75) Inventors: Paul Rich, Bristol (GB); David John Thomas, Chepstow (GB)

(73) Assignee: Trikon Technologies Limited, Gwent (GB)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 1019 days.

(21) Appl. No.: 08/727,303

(22) Filed: Oct. 8, 1996

(51) Int. Cl.$^7$ .......................... C23C 14/34; B05D 3/02; H01L 21/4763; H01L 21/44

(52) U.S. Cl. ............................. 204/192.1; 427/372.2; 427/383.1; 427/377; 427/376.6; 438/626; 438/632; 438/660; 438/661

(58) Field of Search ................... 437/190, 192, 437/194; 438/626, 632, 660, 661; 204/192.1; 427/372.2, 383.1, 377, 376.6

(56) References Cited

U.S. PATENT DOCUMENTS

| | | | |
|---|---|---|---|
| 4,994,162 A | * | 2/1991 | Armstrong et al. .. 204/192.3 X |
| 5,108,570 A | * | 4/1992 | Wang .................. 204/192.3 X |
| 5,171,412 A | * | 12/1992 | Talieh et al. ........ 204/192.17 X |
| 5,266,521 A | * | 11/1993 | Lee et al. ................ 437/192 X |
| 5,278,448 A | * | 1/1994 | Fujii ...................... 437/192 X |
| 5,283,206 A | * | 2/1994 | Sugano ................... 437/192 X |
| 5,358,616 A | * | 10/1994 | Ward ................. 204/192.17 X |
| 5,427,666 A | * | 6/1995 | Mueller et al. ......... 437/192 X |
| 5,523,259 A | * | 6/1996 | Merchant et al. ....... 437/192 X |
| 5,552,341 A | * | 9/1996 | Lee ......................... 437/194 X |
| 5,599,739 A | * | 2/1997 | Merchant et al. ........... 437/190 |

FOREIGN PATENT DOCUMENTS

| EP | 0 516 344 A1 | 12/1992 |
|---|---|---|
| WO | WO 96/02938 | 2/1996 |

* cited by examiner

Primary Examiner—Steven H. Ver Steey
(74) Attorney, Agent, or Firm—Volentine Francos, PLLC

(57) ABSTRACT

A workpiece is processed which includes a multiplicity of recesses formed in the exposed surface. The invention includes depositing a first barrier layer 13 of for example, titanium nitride, a second layer 11 of aluminium alloy and a third relatively thin layer 12 of titanium nitride and then exposing the sandwich of layers to elevated heat and pressure so that the second layer is deformed to fill the recesses 10.

14 Claims, 2 Drawing Sheets

METHOD OF PROCESSING A WORKPIECE

BACKGROUND OF THE INVENTION

The present invention relates to methods of processing workpieces having a multiplicity of recesses formed in an exposed surface and in particular, but not exclusively, where those recesses are of high aspect ratio and are present in high density.

In both the fields of micro engineering and the formation of semiconductor devices, it is becoming increasingly necessary to be able to fill recesses having high aspect ratios, particularly in order to form conductive paths between parts of the devices. In the field of semiconductor devices in particular, there is an increasing need to be able to fill such recesses when they are arrayed very close together and/or in high densities.

In our European Patent Application No. 0 516 344, we describe a method of filling such recesses which comprises the steps of depositing a layer of material on to the exposed surface of a workpiece having a multiplicity of recesses until all the recesses are bridged and then applying elevated temperatures and pressures to the layer so that the layer is deformed, without melting, to fill the respective recesses. In general, this process has been extremely successful in dealing with the problem of high aspect ratio recesses, but difficulties have been experienced, when there is a high density of recesses or when the grain structure of the deposited layer is such that localised shearing takes places as the material moves down into the recess.

SUMMARY OF THE INVENTION

From one aspect the invention consists in a method of processing a workpiece having a multiplicity of recesses formed in an exposed surface, the material comprising depositing a first layer of material on the exposed surface over all the recesses to close the openings, depositing a second layer on top of the first and applying heat and pressure to the layers such that the first layer is urged into the recesses to fill them.

From another aspect the present invention consists in a method of processing a workpiece having a multiplicity of recesses formed in an exposed surface, the method comprising depositing a first layer of material on the exposed surface until the first layer extends over all the recesses to close completely the openings of all the recesses in the exposed surface and subjecting the wafer and the first layer to elevated pressure and an elevated temperature sufficient to cause parts of the first layer to deform, without melting, to fill respective recesses characterised in that a second layer of material is deposited on the top of the first layer prior to or during the application of temperature and pressure.

It is particularly preferred that the second layer is an anti-reflective coating, because such a coating is required at a later stage in the normal production sequence. This layer may be deposited by sputtering or other suitable technique and may for example be titanium nitride.

Where the first layer is a metal, the second layer may be an oxide or nitride of the first layer. For example, a native oxide may be formed by introducing oxygen or exposing the wafer to atmosphere by means of a "vacuum break". The nitride may be formed by exposing the second layer to nitrogen during the application of high pressure.

The second layer is thin relative to the first layer. For example, if it is an oxide, the layer may be in the range of 15 Å to 25 Å or an anti-reflective coating may be typically be of the order of 100 Å to 500 Å. This contrasts with the first layer of thickness, which, for aluminium alloy, may be typically be 2500 Å to 50,000 Å. Usually the first layer will be a metallic electrical conductor such as an aluminium alloy, copper or gold. Gold would require a coating such as titanium nitride as it does not readily form oxides or nitrides.

The method may also include depositing a thin layer of material prior to the deposition of the first layer to form a barrier or lubricating layer. This may be titanium nitride or indeed a prior layer of the material of the first layer.

The invention also includes devices formed using such a process.

Although the invention has been defined above it is to be understood that it covers any inventive combination of the features set out above or in the following description.

BRIEF DESCRIPTION OF THE DRAWINGS

The invention may be performed in various ways and a specific embodiment will now be described, with reference to the accompanying drawings, in which.

DETAILED DESCRIPTIONS OF THE PREFERRED EMBODIMENT

Figure 1:
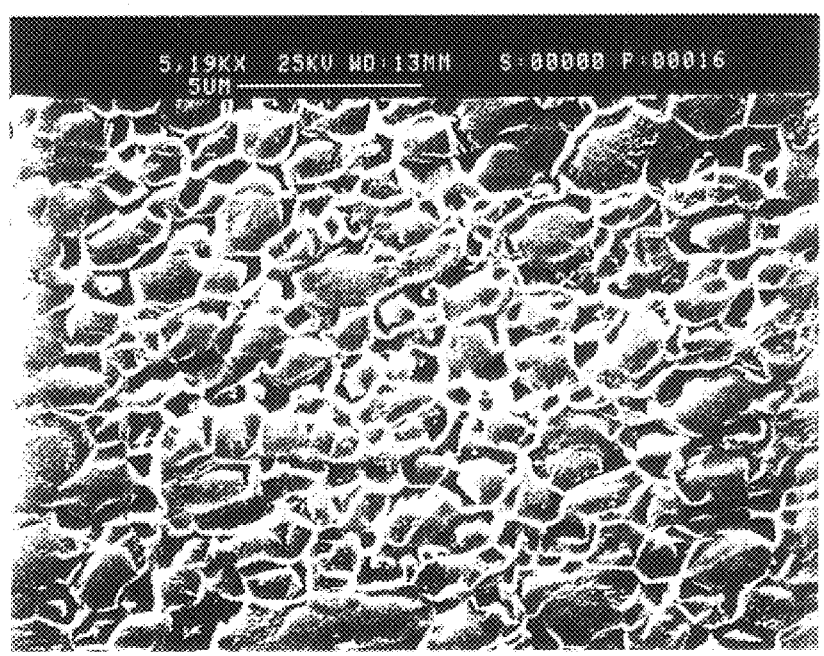
FIG. 1 is a scanning electron micrograph of a wafer processed by the method of European Patent Application No. 0 516 344 with anti-reflective coating deposited after the recess filling has taken place.

It has been found that when high pressure and heat are applied to force a layer of aluminum or similar material into high aspect ratio recesses or indentations on a semiconductor wafer or the like, the top surface of the layer can, under certain conditions, become rough and the grain structure can appear irregular. This phenomenon becomes more pronounced when there are many recesses in close proximity to each other. FIG. 1 illustrates an example of this.

Figure 2:
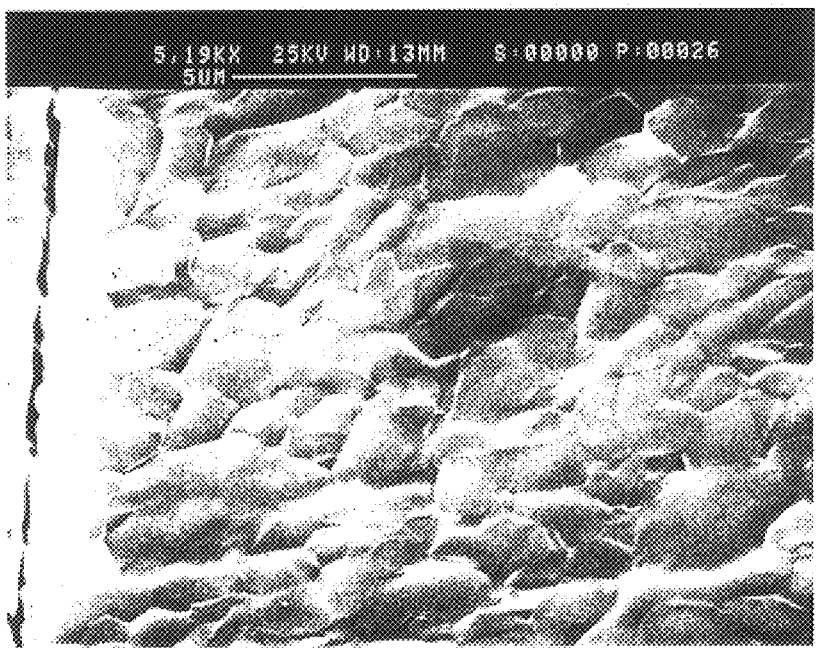
FIG. 2 is scanning electron micrograph of wafer processed with the anti-reflective coating deposited prior to the application of high pressure and temperature.
Figure 3:
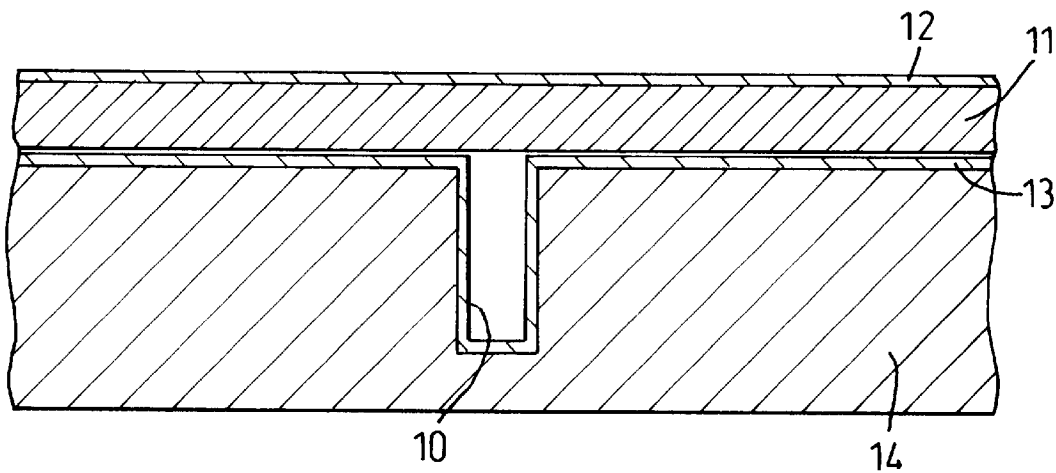
FIG. 3 is a schematic cross-section illustrating a recess prior to the application of elevated pressure and temperature.
Figure 4:
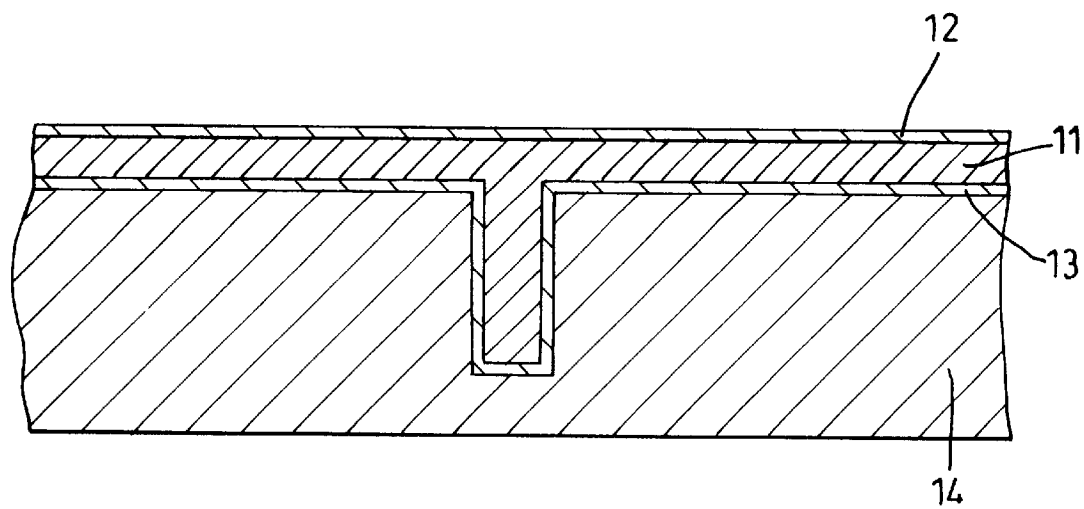
FIG. 4 illustrates the recess after the increase in pressure and temperature.

In the method of the present invention such recesses 10 are filled by depositing a first layer of material 11 to close completely all the openings of the recesses in the exposed surface to be treated, then depositing a thin second layer 12 on the top of that first layer 11 and subsequently exposing the two layers 12 to elevated pressure and temperature sufficient to cause the first layer to deform, without melting to fill respective recesses 10. FIGS. 3 and 4 illustrate the before and after positions whilst FIG. 2 shows the result of the process of the invention and it will be noted that there is a dramatic improvement in the smoothness of the upper surface of the resultant layer and the grain structure is more regular.

It is particularly convenient to form this second thin layer 12 as an anti-reflective coating (eg. sputter titanium nitride), because such a coating is required subsequently in the processing. However, it has be determined that the layer may also be an oxide or nitride of the material of the first layer. The oxide can be formed by exposing the first layer to oxygen or atmosphere, for example by creating a vacuum break in the processing. A nitride layer can be formed by exposing the layer to nitrogen and this can conveniently be done during the application of high pressure.

Typically the first layer will be a metallic conductor such as aluminium alloy, copper or gold.

It is preferred that a barrier layer 13 is deposited on the surface of the workpiece 14, when it is a semiconductor wafer, partly to avoid spiking of gate oxide but partly because it has been discovered that such a barrier layer serves to facilitate the deformation of the first layer into the recesses.

The precise temperature and pressure conditions necessary to achieve the deformation of the layer will depend on the materials used but, for aluminum or aluminum alloys, temperatures in excess of 350° C. and pressures in excess of $20 \times 10^6$ Pa (3,000 p.s.i.) have been found to be suitable, but lower temperature and/or pressure may also be effective. Alloys commonly used for forming conductive tracks are of composition Al/O-2% Si/O-4% Cu/O-2%, Ti, and these have been found to deform suitably under such conditions.

Aluminum, or some aluminum alloys, are particularly suitable for use with the present invention because their yield strengths decrease gradually with temperature. Thus, they will deform to move into or fill the hole at temperatures significantly below their melting point. For other materials, since it is often desirable to avoid very high temperatures, it may be difficult to ensure that suitable deformation occurs below the melting point.

However, it may still be possible to achieve this with suitably precise temperature control.

If aluminum is used, temperatures in the range of 350° C. to 650° C. and pressures in excess of 3,000 p.s.i. have been found to be suitable. Indeed, it is believed that the pressures may be as high as $350 \times 10^6$ (50,000 p.s.i.) or even higher enabling the use of temperatures less than 350° C. The duration of such pressure and temperature conditions is also not thought to be critical, and inert or reactive gasses may be used to create the high pressure.

However, the second layer can also be used with other hole filling systems in which a layer of material is urged into recesses by means of heat and pressure.

What is claimed is:

1. A method of processing a workpiece having a multiplicity of recesses formed in an exposed surface, the multiplicity of recesses having respective openings, said method comprising:

depositing a first layer of material on the exposed surface until the first layer extends over all the recesses to close completely the openings of all the recesses in the exposed surface and to form respective voids within the recesses beneath the first layer;

increasing a pressure and a temperature applied to the wafer and the first layer after the respective voids have been formed with the recesses beneath the first layer, to cause parts of the first layer to deform, without melting, to fill the voids in the respective recesses; and depositing a second layer of material on top of the first layer after said depositing of the first layer either prior to or during application of the increased temperature and pressure, wherein the second layer is an anti-reflective coating.

2. A method as claimed in claim 1 wherein the second layer is deposited by sputtering.

3. A method as claimed in claim 2 wherein the second layer is 100 Å–400 Å thick.

4. A method as claimed in claim 1 wherein the second layer is Titanium Nitride.

5. A method as claimed in claim 4 wherein the second layer is 100 Å–400 Å thick.

6. A method as claimed in claim 1 wherein the first layer is a metal and the second layer is an oxide or nitride of the first layer.

7. A method as claimed in claim 6 wherein the nitride is formed by exposing the second layer to Nitrogen during the application of the increased pressure.

8. A method as claimed in claim 7 wherein the second layer is in the range 15 Å–25 Å thick.

9. A method as claimed in claim 6 wherein the second layer is in the range 15 Å–25 Å thick.

10. A method as claimed in claim 1 wherein the second layer is 100 Å–400 Å thick.

11. A method as claimed in claim 1 wherein the first layer is one of aluminium, aluminium alloy, copper or gold.

12. A method as claimed in claim 11 wherein the first layer has a thickness between about 2500 Å to about 50,000 Å.

13. A method as claimed in claim 1 further comprising depositing a thin layer of material prior to the deposition of the first layer to form a barrier or lubricating layer.

14. A method of processing a workpiece having a multiplicity of recesses formed in an exposed surface, the multiplicity of recesses having respective openings, said method comprising:

depositing a first layer of material on the exposed surface over all the recesses to close the openings of the recesses and to form respective voids within the recesses beneath the first layer;

depositing a second layer of material on top of the first layer after said depositing of the first layer, wherein the second layer is an anti-reflective coating;

applying increased heat and pressure to the first and second layers after the respective voids have been formed within the recesses beneath the first layer, to cause the first layer to be urged into the recesses to fill the voids in the recesses.

* * * * *